(12) United States Patent
Kim et al.

(10) Patent No.: US 7,626,422 B2
(45) Date of Patent: Dec. 1, 2009

(54) OUTPUT DRIVER AND METHOD THEREOF

(75) Inventors: Kyu-hyoun Kim, Suwon-si (KR); Chang-hyun Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 249 days.

(21) Appl. No.: 11/176,396

(22) Filed: Jul. 8, 2005

(65) Prior Publication Data
US 2006/0076980 A1    Apr. 13, 2006

(30) Foreign Application Priority Data
Oct. 8, 2004    (KR) ............... 10-2004-0080355
Jan. 26, 2005    (KR) ............... 10-2005-0007226

(51) Int. Cl.
*H03K 19/094* (2006.01)
*H03K 19/0175* (2006.01)

(52) U.S. Cl. ............... 326/83; 326/87; 327/108

(58) Field of Classification Search ............ 326/68, 326/81–83, 86–87, 112, 115, 126, 127; 327/108, 327/109, 51–57
See application file for complete search history.

(56) References Cited

U.S. PATENT DOCUMENTS

| 6,847,225 B2 * | 1/2005 | Viehmann et al. ............. 326/30 |
| 6,956,442 B2 * | 10/2005 | Groen et al. ............. 331/57 |
| 6,958,442 B2 * | 10/2005 | Moussa ............. 84/645 |
| 6,975,132 B2 * | 12/2005 | Groen et al. ............. 326/27 |
| 7,061,273 B2 * | 6/2006 | Wang et al. ............. 326/86 |
| 7,064,617 B2 * | 6/2006 | Hein et al. ............. 331/16 |
| 2002/0087820 A1 * | 7/2002 | Garlepp et al. ............. 711/167 |
| 2003/0026119 A1 * | 2/2003 | Ooishi ............. 365/20 |
| 2003/0128056 A1 * | 7/2003 | Nilson et al. ............. 327/65 |
| 2004/0041593 A1 * | 3/2004 | Lai ............. 326/115 |
| 2004/0227554 A1 * | 11/2004 | Park ............. 327/280 |
| 2005/0218941 A1 * | 10/2005 | Kushiyama et al. ............. 327/108 |
| 2005/0285629 A1 * | 12/2005 | Hein et al. ............. 326/115 |
| 2007/0098026 A1 * | 5/2007 | Uesaka et al. ............. 372/29.01 |

FOREIGN PATENT DOCUMENTS

| EP | 0 998 040 A2 | 5/2000 |
| JP | 62-243194 A | 10/1987 |
| JP | 08-139543 A | 5/1996 |

* cited by examiner

*Primary Examiner*—Rexford N Barnie
*Assistant Examiner*—Dylan White
(74) *Attorney, Agent, or Firm*—Harness, Dickey & Pierce, P.L.C.

(57) ABSTRACT

An output driver and method thereof. In the method, a current may be adjusted to adjust a power consumption in response to a change in a data rate. A first example output driver may include at least one transistor receiving at least one input signal, at least one resistor connected between the at least one transistor and a first voltage and a tail current source connected between the at least one transistor and a second voltage, the tail current source controlling a given current level of at least one signal based at least in part on the given data rate. A second example output driver may include a first differential amplification unit, including a first tail current source, receiving first and second input signals and a second differential amplification unit, including a second tail current source, receiving third and fourth input signals, at least one of the first and second tail current sources controlling a given current level of at least one signal based at least in part on the given data rate.

15 Claims, 11 Drawing Sheets

HIGHER-SPEED DATA-RATE

LOWER-SPEED DATA-RATE

HIGHER-SPEED DATA-RATE
(WITH PREEMPTIVE CONTROL OPERATION)

LOWER-SPEED DATA-RATE
(WITHOUT PREEMPTIVE CONTROL OPERATION)

OUTPUT DRIVER AND METHOD THEREOF

PRIORITY STATEMENT

This application claims the benefit of Korean Patent Application Nos. 10-2004-0080355, filed on Oct. 8, 2004, and 10-2005-0007226, filed on 26 Jan. 2005 in the Korean Intellectual Property Office, the disclosure of which is incorporated herein in its entirety by reference.

BACKGROUND OF THE INVENTION

1. Field of the Invention

The present invention relates to a semiconductor memory device and method thereof, and more particularly, to an output driver and method thereof.

2. Description of the Related Art

FIG. 1 illustrates a conventional differential input/output driver 100. Referring to FIG. 1, the differential input/output driver 100 may compare input signals IN1 and IN2 and may output a result of the comparison as a data input/output signal DQ and a complementary data input/output signal DQB. The differential input/output driver 100 may include a first NMOS transistor 101 having a gate receiving a first input signal IN1 and a second NMOS transistor 102 having a gate receiving a second input signal IN2. Sources of the first and second NMOS transistors 101 and 102 may be connected to a ground voltage VSS via a tail current source 105. Drains of the first and second NMOS transistors 101 and 102 may be connected to a power supply voltage VCC via first and second resistors 103 and 104, respectively, which may output the data input/output signal DQ and the complementary data input/output signal DQB, respectively.

FIG. 2 illustrates a graph of an amplitude of a current IDRV of the current source 105 of FIG. 1. As shown in FIG. 2, the current IDRV of the current source 105 may be relatively constant irrespective of an operating frequency FREQ.

FIG. 3 illustrates waveforms of the data input/output signal DQ and the complementary data input/output signal DQB at a higher-speed data rate and a lower-speed data rate of the differential input/output driver 100 of FIG. 1. Referring to FIG. 3, a slew rate of the data input/output signal DQ and the complementary data input/output signal DQB at the higher-speed data rate may be similar to a slew rate at the lower-speed data rate. The slew rate of a waveform may refer to a time required for a transition between a first logic level (e.g., a higher logic level, a lower logic level, etc.) and a second logic level (e.g., a lower logic level, a higher logic level, etc.). If the lower-speed data rate is used by the differential input/output driver 100, the integrity or swing width of the data input/output signal DQ and the complementary data input/output signal DQB may be higher.

If an output driver (e.g., the differential input/output driver 100) operates at the lower-speed data rate, a swing width between signals may be reduced. The reduced swing width may not negatively affect a discrimination between signal levels and power consumption in the output driver may thereby be reduced.

However, conventional output drivers (e.g., the differential input/output driver 100) may typically be set to consume a given amount of power (e.g., for a lower speed date rate, for a higher speed date rate, etc.) and may not change the power consumption during operation. Thus, conventional output drivers may be data-rate specific with respect to power consumption.

SUMMARY OF THE INVENTION

An example embodiment of the present invention is directed to an output driver operating at a given data rate, including at least one transistor receiving at least one input signal, at least one resistor connected between the at least one transistor and a first voltage and a tail current source connected between the at least one transistor and a second voltage, the tail current source controlling a given current level of at least one signal based at least in part on the given data rate.

Another example embodiment of the present invention is directed to an output driver operating at a given data rate, including a first differential amplification unit, including a first tail current source, receiving first and second input signals and a second differential amplification unit, including a second tail current source, receiving third and fourth input signals, at least one of the first and second tail current sources controlling a given current level of at least one signal based at least in part on the given data rate.

Another example embodiment of the present invention is directed to a method of controlling an output driver, including adjusting a current to adjust a power consumption in response to a change in a data rate.

BRIEF DESCRIPTION OF THE DRAWINGS

The accompanying drawings are included to provide a further understanding of example embodiments of the invention, and are incorporated in and constitute a part of this specification. The drawings illustrate example embodiments of the present invention and, together with the description, serve to explain principles of example embodiments of the present invention.

DETAILED DESCRIPTION OF EXAMPLE EMBODIMENTS OF THE PRESENT INVENTION

Figure 1:
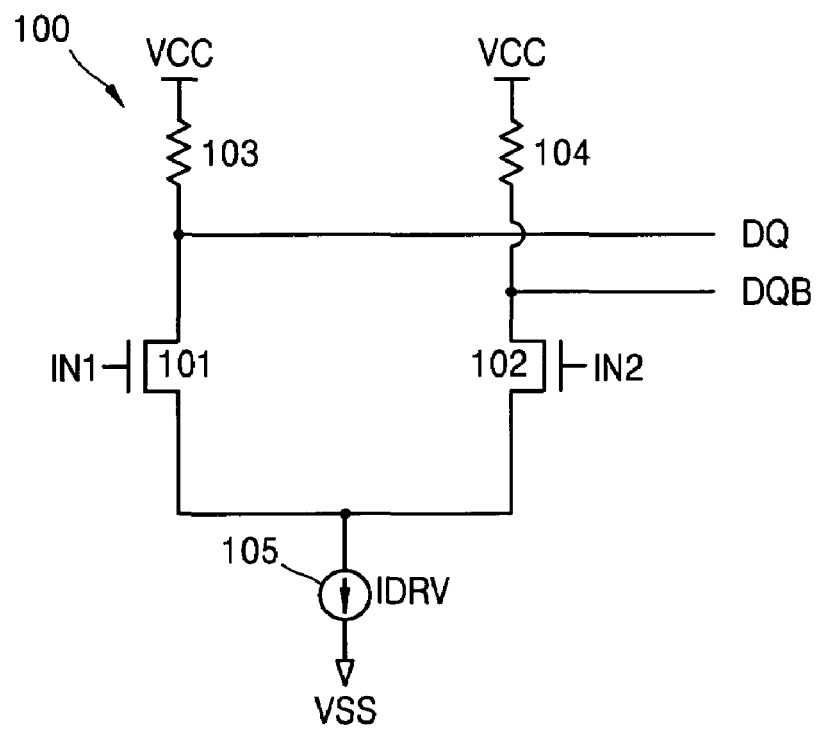
FIG. 1 illustrates a conventional differential input/output driver 100.
Figure 2:
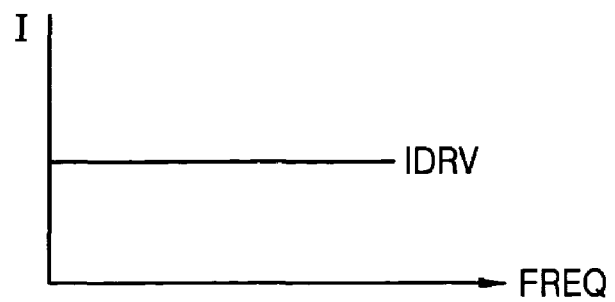
FIG. 2 illustrates a graph of an amplitude of a current IDRV of the current source 105 of FIG. 1.
Figure 3:
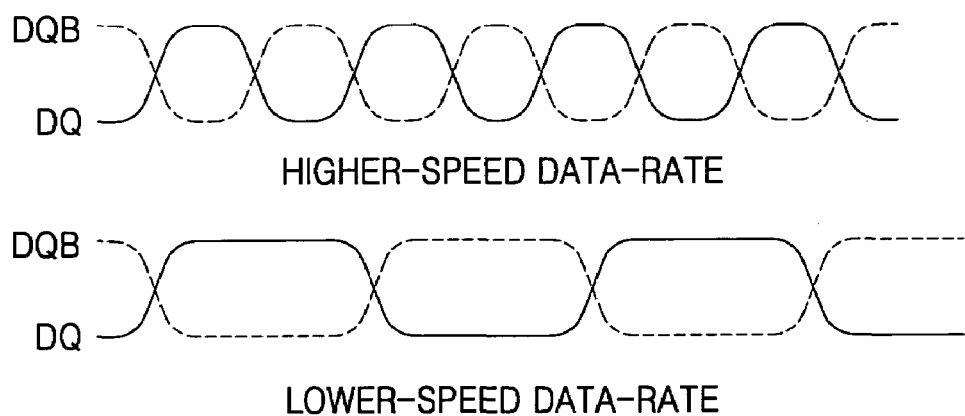
FIG. 3 illustrates waveforms of the data input/output signal DQ and the complementary data input/output signal DQB at a higher-speed data rate and a lower-speed data rate of the differential input/output driver of FIG. 1.

Hereinafter, example embodiments of the present invention will be described in detail with reference to the accompanying drawings.

In the Figures, the same reference numerals are used to denote the same elements throughout the drawings.

Figure 4:
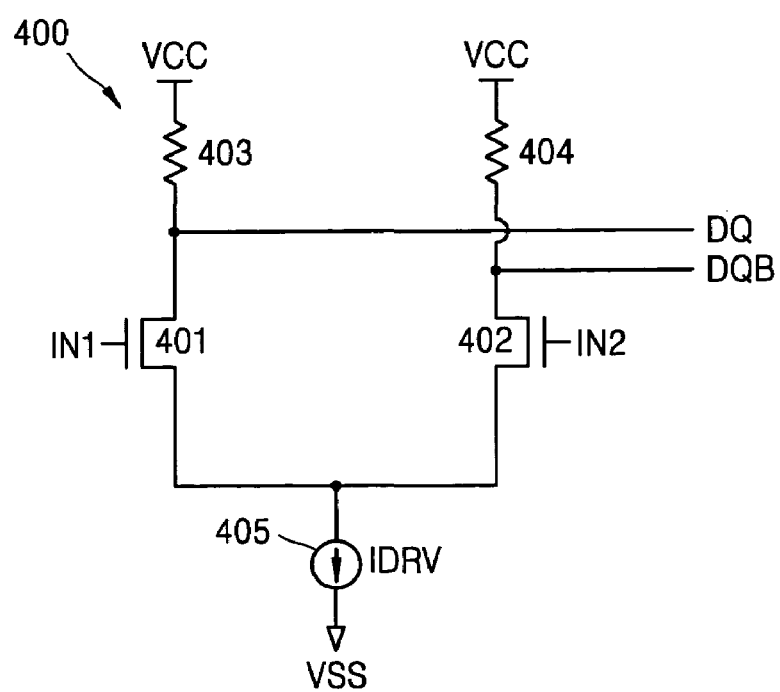
FIG. 4 illustrates an output driver according to an example embodiment of the present invention.

FIG. 4 illustrates an output driver 400 according to an example embodiment of the present invention.

In the example embodiment of FIG. 4, the output driver 400 may include a first NMOS transistor 401 and a second NMOS transistor 402 having gates receiving a first input signal IN1 and a second input signal IN2, respectively. The output driver 400 may further include a first resistor 403 connected between the first NMOS transistor 401 and a power supply voltage VCC and a second resistor 404 connected between the second NMOS transistor 402 and the power supply voltage VCC. A tail current source 405 having a current IDRV may be connected between sources of the first and second NMOS transistors 401 and 402 and a ground voltage VSS. Drains of the first and second NMOS transistors 401 and 402 may output a data input/output signal DQ and a complementary data input/output signal DQB, respectively.

Figure 5:
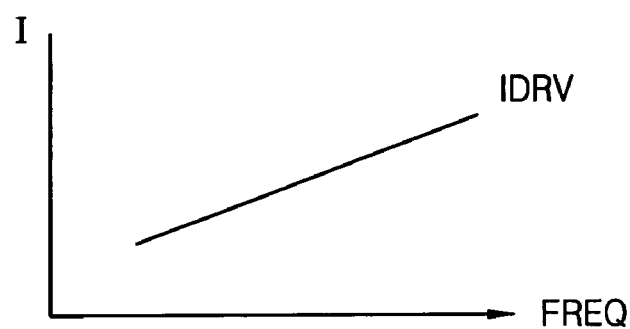
FIG. 5 illustrates a graph of an amplitude of the current IDRV of the tail current IDRV of FIG. 4 according to another example embodiment of the present invention.

FIG. 5 illustrates a graph of an amplitude of the current IDRV of the tail current IDRV of FIG. 4 according to another example embodiment of the present invention.

In the example embodiment of FIG. 5, the current IDRV at the tail current source 405 may vary with an operating frequency of the output driver 400 (e.g., based on a control signal as discussed below in greater detail with respect to FIG. 6). In an example, as illustrated in FIG. 5, the current IDRV may scale with the operating frequency FREQ of the output driver 400. Thus, the current IDRV may increase as the operating frequency FREQ increases. Likewise, the current IDRV may decrease as the operating frequency FREQ decreases.

Figure 6:
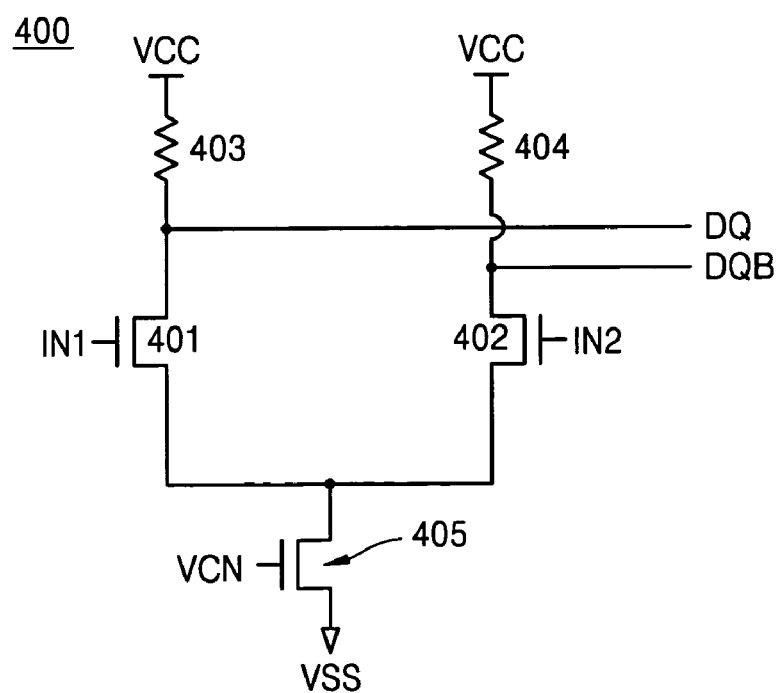
FIG. 6 illustrates the output driver of FIG. 4 according to another example embodiment of the present invention.

FIG. 6 illustrates the output driver 400 of FIG. 4 according to another example embodiment of the present invention.

In the example embodiment of FIG. 6, the tail current source 405 may include an NMOS transistor that may be controlled (e.g., may be turned on or pass current) in response to a control signal VCN. The NMOS transistor may be turned on in response to a first logic level (e.g., a higher logic level) of the control signal VCN. When the NMOS transistor is turned on, the current IDRV may increase. The control signal VCN may be received from a delay locked loop circuit and/or a phase locked loop circuit, as will be described in greater detail below with respect to the example embodiments of FIG. 7 and FIG. 8.

Figure 7:
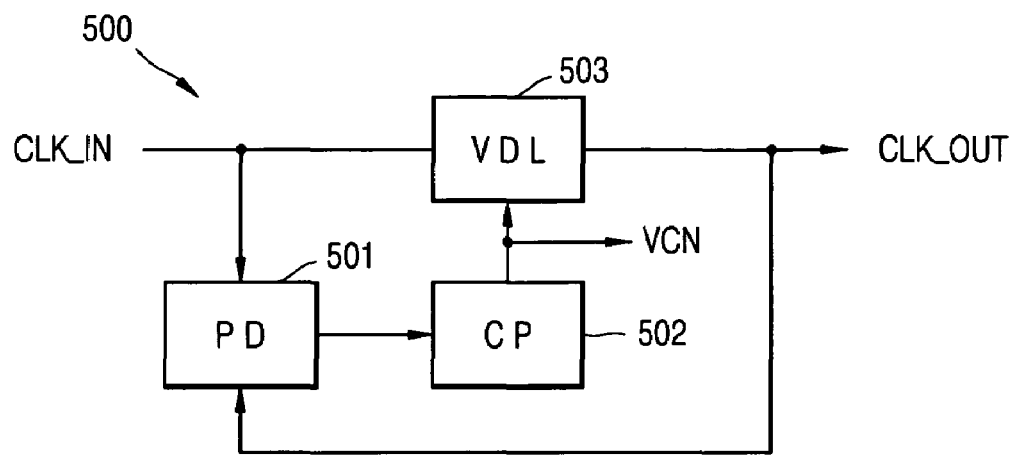
FIG. 7 illustrates a delay locked loop circuit according to another example embodiment of the present invention.

FIG. 7 illustrates a delay locked loop circuit 500 according to another example embodiment of the present invention.

In the example embodiment of FIG. 7, the delay locked loop circuit 500 may include a phase detector (PD) 501, a charge pump (CP) 502 and a variable delay line circuit (VDL) 503. The PD 501 may compare a degree of delay of an input clock signal CLK_IN with a degree of delay of an output clock signal CLK_OUT to determine a difference between the clock signal delays. The PD 501 may transmit the clock signal delay difference to the CP 502. The CP 502 may generate the control signal VCN, which may be proportional to the clock signal delay difference received from the PD 501. The VDL 503 may adjust (e.g., decrease or increase) a delay of the input clock signal CLK_IN in response to the control signal VCN to synchronize edges of the input clock signal CLK_IN with those of the output clock signal CLK_OUT.

In another example embodiment of the present invention, referring to FIG. 7, the clock signal delay difference between the input clock signal CLK_IN and the output clock signal CLK_OUT may scale with a frequency of the input clock signal CLK_IN. Thus, the voltage level of the control signal VCN may likewise increase as the clock signal delay difference increases.

Figure 8:
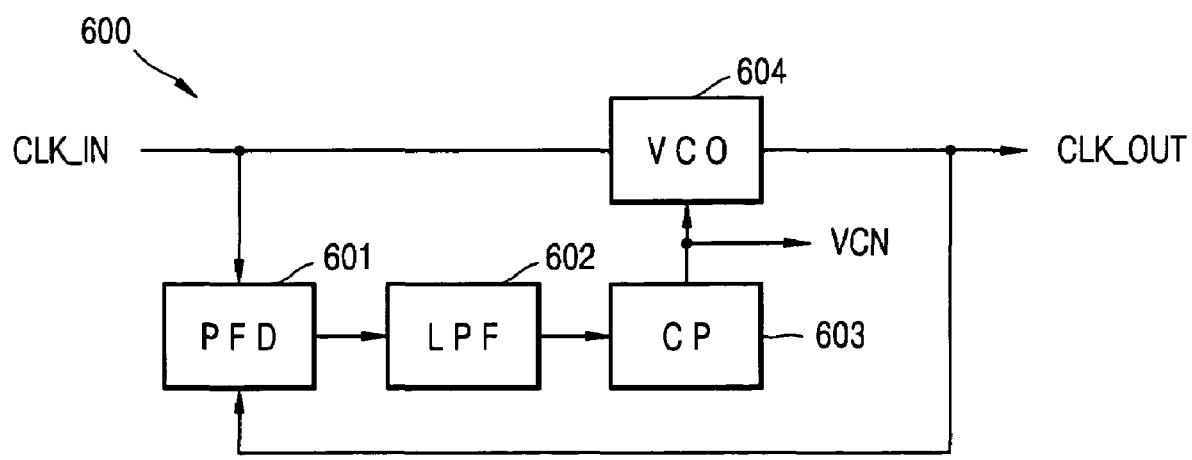
FIG. 8 illustrates a phase locked loop circuit according to another example embodiment of the present invention.

FIG. 8 illustrates a phase locked loop circuit 600 according to another example embodiment of the present invention.

In the example embodiment of FIG. 8, the phase locked loop circuit 600 may include a phase frequency detector (PFD) 601, a low-pass filter (LPF) 602, a CP 603 and a voltage-controlled oscillator (VCO) 604. The PFD 601 may detect a phase difference between an input clock signal CLK_IN and an output clock signal CLK_OUT and a frequency corresponding to the phase difference and may generate up/down signals based on the detected phase difference. The LPF 602 may filter out (e.g., remove) a higher-frequency component from an output of the PFD 601 and may transmit a result of the filtering to the CP 603. The CP 603 may generate the control signal VCN in response to the up/down signals received from the PFD 601. The VCO 604 may generate the output clock signal CLK_OUT, which may be proportional to a voltage level of the control signal VCN.

In another example embodiment of the present invention, referring to FIG. 8, the clock signal delay difference between the input clock signal CLK_IN and the output clock signal CLK_OUT may scale with a frequency of the input clock signal CLK_IN. Thus, the voltage level of the control signal VCN may likewise increase as the clock signal delay difference increases.

In the example embodiments of FIG. 7 and FIG. 8, the control signal VCN generated by the delay locked loop circuit 500 and/or the phase locked loop circuit 600 may be set to the first voltage level (e.g., a higher voltage level) as an operating frequency of the delay locked loop circuit 500 and/or the phase locked loop circuit 600 increases. Thus, as above-described with respect to FIG. 5, the current IDRV of the delay locked loop circuit 500 and/or the phase locked loop circuit 600 may vary (e.g., increase or decrease) in response to a change in an operating frequency (e.g., the operating frequency FREQ).

Figure 9:
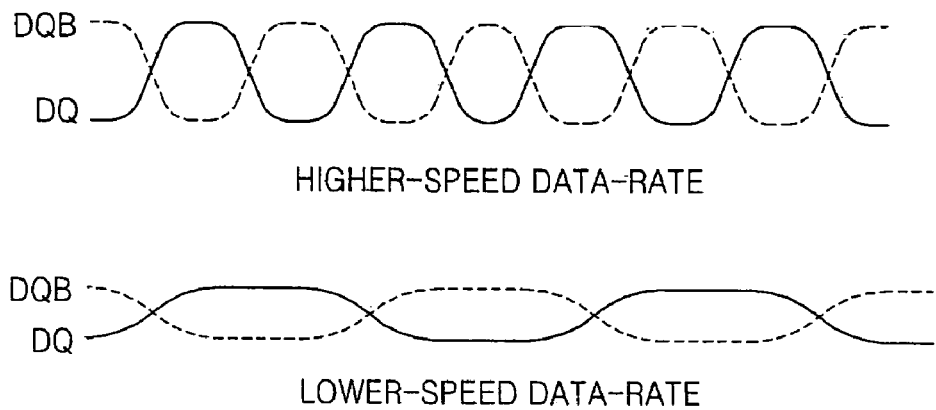
FIG. 9 illustrates waveforms of the data input/output signal DQ and the complementary data input/output signal DQB at a higher-speed data rate and a lower-speed data rate of the output driver of FIG. 6.

FIG. 9 illustrates waveforms of the data input/output signal DQ and the complementary data input/output signal DQB at a higher-speed data rate and a lower-speed data rate of the output driver 400 of FIG. 6.

In the example embodiment of FIG. 9, when the output driver 400 uses the higher-speed data rate, a swing width between the data input/output signals DQ and DQB may be larger. Alternatively, when the output driver 400 uses a lower-speed data rate, the swing width between the data input/output signals DQ and DQB may be smaller. In an example, a reduction of a swing width due to inter-symbol interference (e.g., which may affect a discrimination between logic levels, e.g., between the first logic level and a second logic level, of signals) may be lower for the output driver 400 using the lower-speed data rate as compared to the output driver 400 using the higher-speed data rate.

Figure 10:
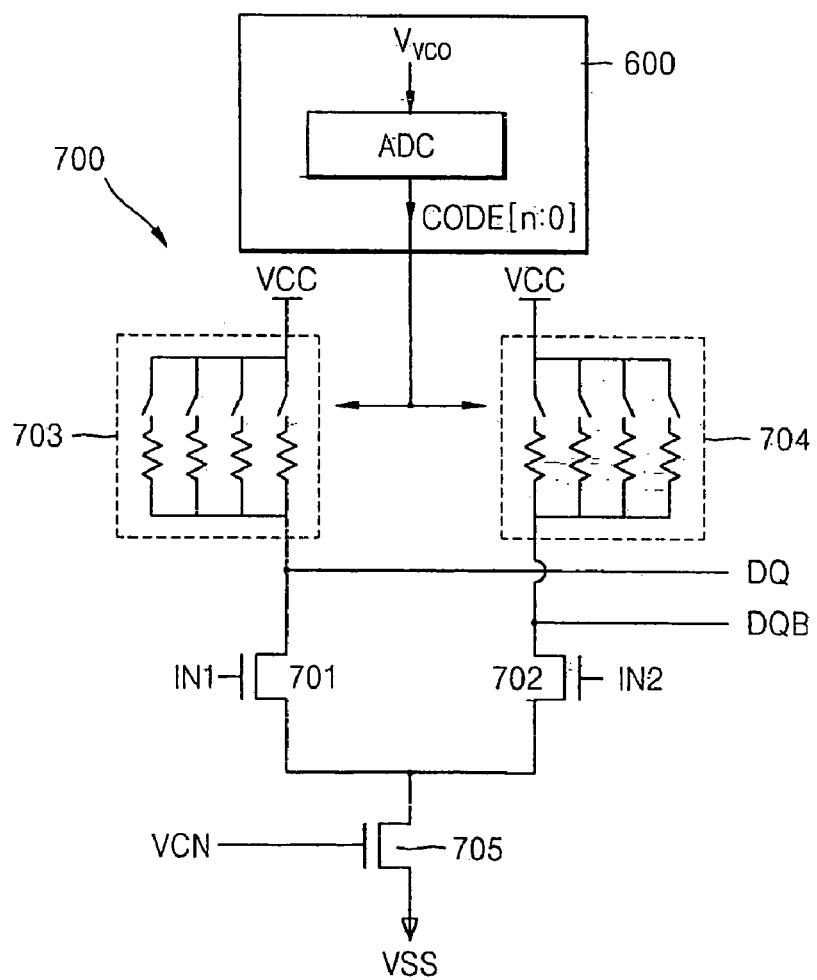
FIG. 10 illustrates an output driver according to another example embodiment of the present invention.

FIG. 10 illustrates an output driver 700 according to another example embodiment of the present invention.

In the example embodiment of FIG. 10, the output driver 700 may include a first NMOS transistor 701, a second NMOS transistor 702, a first resistor group 703, a second resistor group 704 and a third NMOS transistor 705. A first input signal IN1 and a second input signal IN2 may be received by the first and second NMOS transistors 701 and 702, respectively. The first resistor group 703 may be connected (e.g., with resistors of the first resistor group 703 connected in parallel) between the power supply voltage VCC and a drain of the first NMOS transistor 701. The second resistor group 704 may be connected (e.g., with resistors of the second resistor group 704 connected in parallel) between the power supply voltage VCC and a drain of the second NMOS transistor 702.

In the example embodiment of FIG. 10, at least one of the first and second resistor groups 703/704 may be shorted in response to code signals CODE[n:0]. The third NMOS transistor 705 may be connected between sources of the first and second NMOS transistors 701 and 702 and a ground voltage VSS and may be gated by a control signal VCN. The drains of the first and second NMOS transistors 701 and 702 may be the data input/output signal DQ and the complementary input/output signal DQB. The third NMOS transistor 705 may function as a tail current source (e.g., similar to tail current source 405 of FIG. 4).

Figure 11:
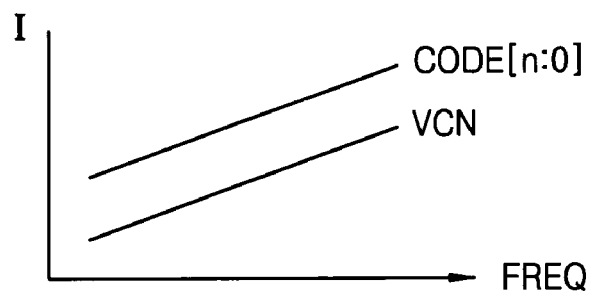
FIG. 11 illustrates a graph of amplitudes for the code signals CODE[n:0] and the control signal VCN of the output driver of FIG. 10 according to another example embodiment of the present invention.

FIG. 11 illustrates a graph of amplitudes for the code signals CODE[n:0] and the control signal VCN of the output driver 700 of FIG. 10 according to another example embodiment of the present invention.

In the example embodiment of FIG. 11, the code signals CODE[n:0] and the control signal VCN may adjust (e.g., increase or decrease) the amount of current flowing in the third NMOS transistor 705 based on an operating frequency FREQ of the output driver 700. As shown in FIG. 11, if the operating frequency FREQ of the output driver 700 is lower, the amount of current in the third NMOS transistor 705 may be lower. Likewise, if the operating frequency FREQ of the output driver 700 is higher, the amount of current flowing in the third NMOS transistor 705 may be higher.

In another example embodiment of present invention, the code signals CODE[n:0] and the control signal VCN may be received by a phase locked loop circuit (e.g., phase locked loop circuit 600 of FIG. 8) (hereinafter, referred to as a "PLL") included within the output driver 700 in a given device (e.g., a memory device) and/or obtained from given information (e.g., column address strobe latency (CASL) information). The control signal VCN may be generated from a VCO voltage $V_{VCO}$ generated by the PLL. The VCO voltage $V_{VCO}$ may scale with an operating frequency of the PLL (e.g., the VCO voltage $V_{VCO}$ may be higher when the operating frequency is higher and the VCO voltage may be lower when the operating frequency is lower). The CASL for which the control signal VCN may be based may scale with the operating frequency of the given device. The code signals CODE[n:0] may be used to convert the VCO voltage $V_{VCO}$ of the PLL from an analog-to-digital domain and may connect resistors in the first and second resistor groups 703 and 704 to the power supply voltage VCC when the given device operates at higher frequencies. Alternatively, the code signals CODE[n:0] may disconnect (e.g., short out) the resistors in the first and second resistors 703 and 704 from the power supply voltage VCC when the given device operates at lower frequencies.

Figure 12:
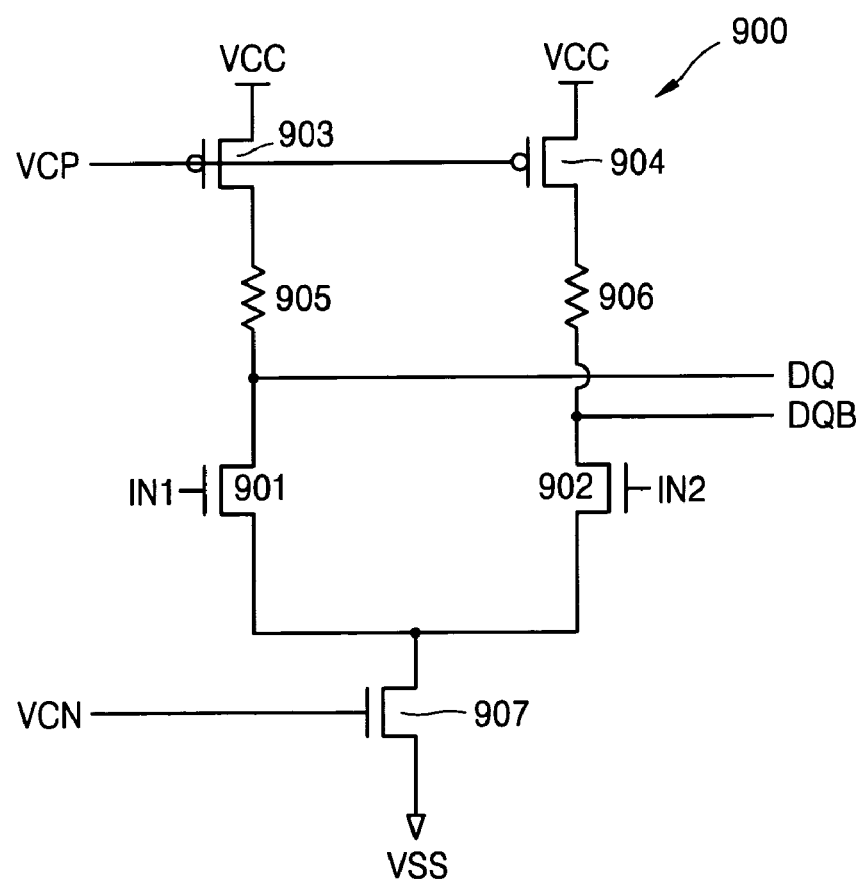
FIG. 12 illustrates an output driver according to another example embodiment of the present invention.

FIG. 12 illustrates an output driver 900 according to another example embodiment of the present invention.

In the example embodiment of FIG. 12, the output driver 900 may include a first NMOS transistor 901, a second NMOS transistor 902, a first PMOS transistor 903, a second PMOS transistor 904, a first resistor 905, a second resistor 906 and a third NMOS transistor 907. A first input signal IN1 and a second input signal IN2 may be received by the first and second NMOS transistors 901 and 902, respectively. The first and second PMOS transistors 903 and 904 may each receive a power supply voltage VCC which may be gated based on a second control signal VCP. The first and second resistors 905 and 906 may be connected between the first PMOS transistor 903 and the first NMOS transistor 901 and between the second PMOS transistor 904 and the second NMOS transistor 902, respectively. The third NMOS transistor 907 may be connected between sources of the first and second NMOS transistors 901 and 902 and a ground voltage VSS and may gate the received sources based on a first control signal VCN. Drains of the first and second NMOS transistors 901 and 902 may output the data input/output signal DQ and the complementary input/output signal DQB. The third NMOS transistor 907 may function as a tail current source (e.g., similar to the tail current source 405 of FIG. 4).

In the example embodiment of FIG. 12, the first and second control signals VCN and VCP may adjust (e.g., increase or decrease) the amount of current flowing in the third NMOS transistor 907 based on an operating frequency of the output driver 900.

Figure 13:
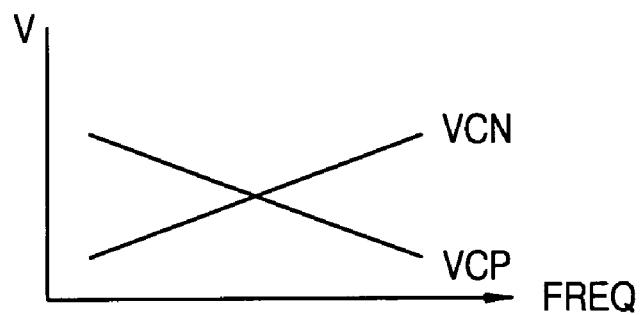
FIG. 13 illustrates a graph of an amplitude of the first and second control signals VCN and VCP of FIG. 12 according to another example embodiment of the present invention.

FIG. 13 illustrates a graph of an amplitude of the first and second control signals VCN and VCN of FIG. 12 according to another example embodiment of the present invention.

In the example embodiment of FIG. 13, the voltage levels of the first and second control signals VCN and VCP may be adjusted in order to control a tail current based on changes in the operating frequency FREQ of the output driver 900. In an example, the first and second control signals VCN and VCP may increase and decrease, respectively, as the operating frequency FREQ increases. Likewise, in another example, the first and second control signals VCN and VCP may decrease and increase, respectively, as the operating frequency FREQ decreases. In an example, the first and second control signals VCN and VCP may be adjusted so as to increase the tail current as the operating frequency FREQ increases and to decrease the tail current as the operating frequency FREQ decreases.

In another example embodiment of the present invention, referring to FIG. 13, the first and second control signals VCN and VCP may be generated based on a VCO voltage $V_{VCO}$ of a PLL included in the output driver 900 in a given device (e.g., a memory device) or from given information (e.g., CASL information).

Figure 14:
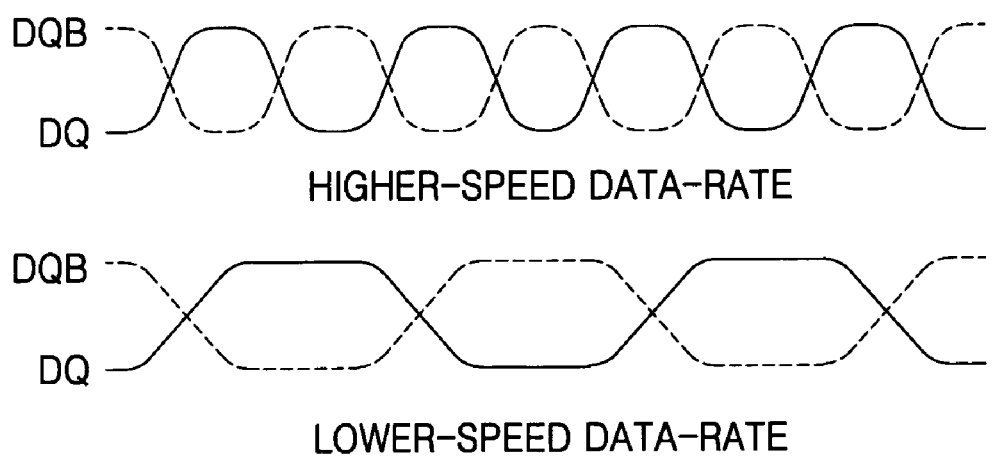
FIG. 14 illustrates waveforms of the data input/output signal DQ and the complementary data input/output signal DQB at a higher-speed data rate and a lower-speed data rate of the output driver of FIG. 10 and the output driver of FIG. 12.

FIG. 14 illustrates waveforms of the data input/output signal DQ and the complementary data input/output signal DQB at a higher-speed data rate and a lower-speed data rate of the output driver 700 of FIG. 10 and the output driver 900 of FIG. 12.

In the example embodiment of FIG. 14, when the output driver 700/900 uses the higher-speed data rate, a swing width between the data/input signals DQ and DQB may be similar to a swing width of the output driver 700/900 using the lower-speed data rate. The slew rate (e.g., a transition inclination or slope of each of the data input/output signals DQ and DQB) may be reduced for the output driver 700/900 at the lower-speed data rate as compared to the output driver 700/900 at the higher-speed data rate.

Figure 15:
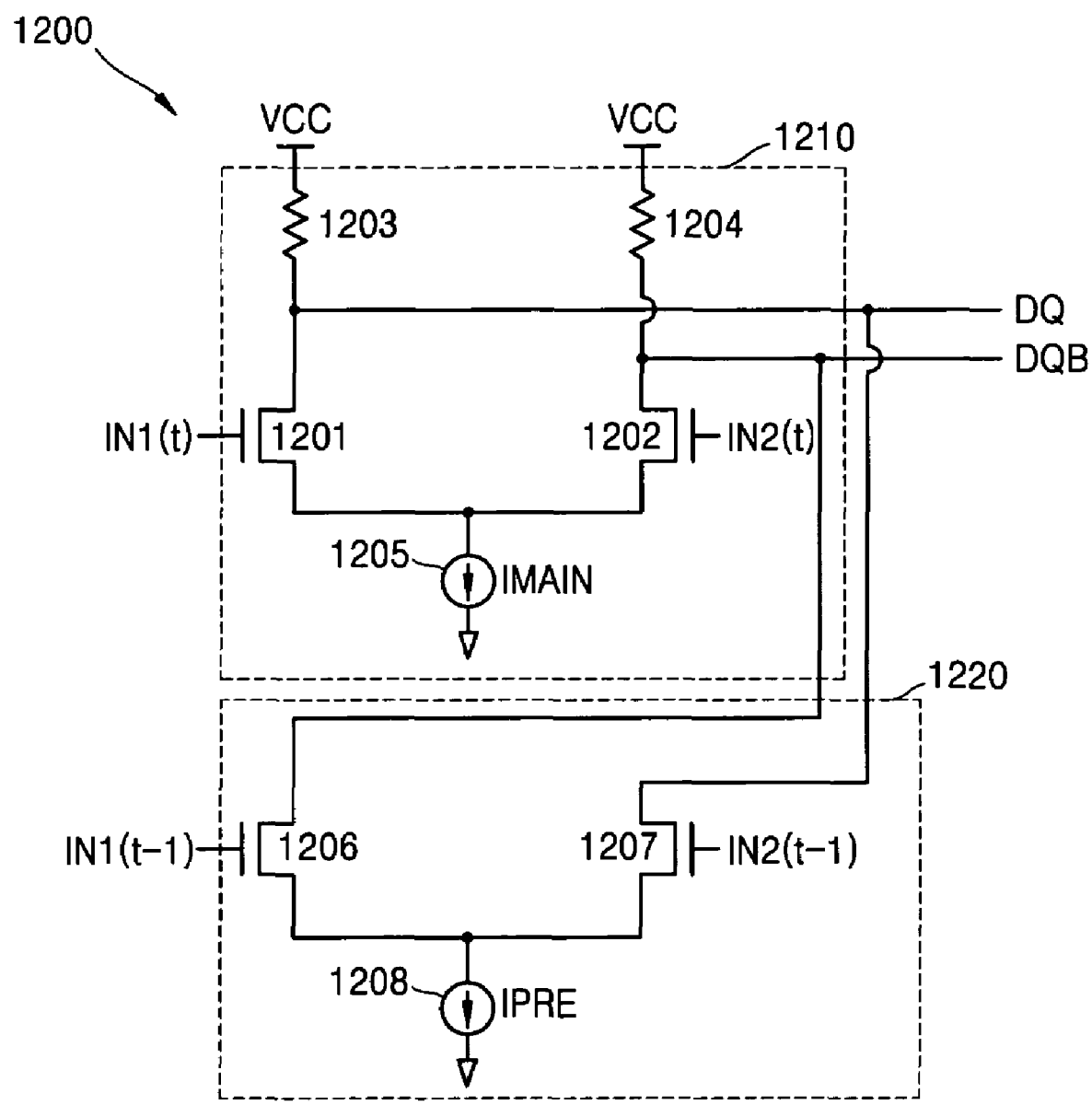
FIG. 15 illustrates an output driver according to another example embodiment of the present invention.

FIG. 15 illustrates an output driver 1200 according to another example embodiment of the present invention.

In the example embodiment of FIG. 15, the output driver 1200 may include a first differential amplification unit 1210 and a second differential amplification unit 1220. The first differential amplification unit 1210 may include a first NMOS transistor 1201 and a second NMOS transistor 1202 having gates receiving a first input signal IN1(t) and a second input signal IN2(t), respectively. The first differential amplification unit 1210 may further include a first resistor 1203 and a second resistor 1204 connected between a drain of the first NMOS transistor 1201 and a power supply voltage VCC and between a drain of the second NMOS transistor 1202 and the power supply voltage VCC, respectively. The first differential amplification unit 1210 may further include a first tail current source 1205 connected between sources of the first and second NMOS transistors 1201 and 1202 and a ground voltage VSS. Drains of the first and second NMOS transistors 1201 and 1202 may output the data input/output signal DQ and the complementary data input/output signal DQB, respectively.

In the example embodiment of FIG. 15, the second differential amplification unit 1220 may include a third NMOS transistor 1206, a fourth NMOS transistor 1207 and a second tail current source 1208. The third and fourth NMOS transistors 1206 and 1207 may have drains which output the data input/output signal DQ and the complementary data input/output signal DQB, respectively. The third and fourth NMOS transistors 1206 and 1207 may further include gates which may receive a previous signal of the first input signal IN(t), which may be referred to as a third input signal IN1(t−1) (e.g., received before the first input signal chronologically), and a previous signal of the second input signal IN2(t), which may be referred to as a fourth input signal IN2(t−1) (e.g., received before the second input signal chronologically), respectively. The second tail current source 1208 may be connected between sources of the third and fourth NMOS transistors 1206 and 1207 and the ground voltage VSS.

In the example embodiment of FIG. 15, if the output driver 1200 uses the higher-speed data rate, the output driver 1200 may adjust (e.g., increase or decrease) logic levels of the data input/output signal DQ and the complementary data input/output signal DQB based on the third and fourth input signals IN1(t−1) and IN2(t−1) from the second differential amplification unit 1220. In an example, the adjustment may be implemented before a generation of the data input/output signal DQ and the complementary data input/output signal DQB from the first and second input signals IN1(t) and IN2(t) using the first differential amplification unit 1210. Thus, the output driver 1200 using the higher-speed data rate may perform a preemptive control operation before generating the data input/output signal DQ and the complementary data input/output signal DQB. In another example, the output driver 1200 using the lower-speed data rate may generate the data input/output signal DQ and the complementary data input/output signal DQB based on the first and second input signals IN1(t) and IN2(t) without performing the preemptive control operation (e.g., using only the first differential amplification unit 1210).

Figure 16:
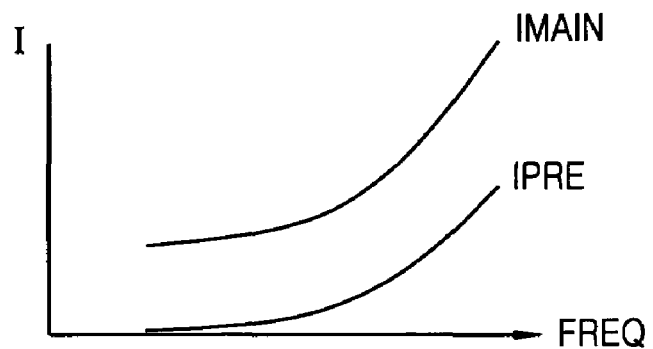
FIG. 16 is a graph illustrating operational current characteristics of the output driver versus operating frequencies of first and second tail current sources according to another example embodiment of the present invention.

FIG. 16 is a graph illustrating operational current characteristics of the output driver 1200 versus operating frequencies of the first and second tail current sources 1205 and 1208 according to another example embodiment of the present invention.

In the example embodiment of FIG. 16, when the operating frequencies of the first and second tail current sources 1205 and 1208 are at a lower level, a first tail current IMAIN generated by the first tail current source 1205 may flow (e.g., above a current threshold). When the operating frequencies of the first and second tail current sources 1205 and 1208 are at a higher level, a second tail current IPRE at the second tail current source 1208 as well as the first tail current IMAIN at the first tail current source 1205 may flow (e.g., both of the first and second tail currents IMAIN/IPRE may be above the current threshold).

Figure 17:
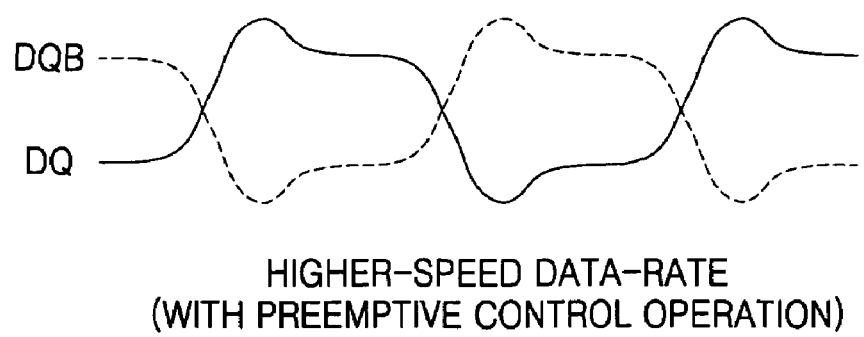
FIG. 17 illustrates waveforms of the data input/output signal DQ and the complementary data input/output signal DQB at a higher-speed data rate and a lower-speed data rate of the output driver of FIG. 15 and the output driver of FIG. 12.
Figure 17:
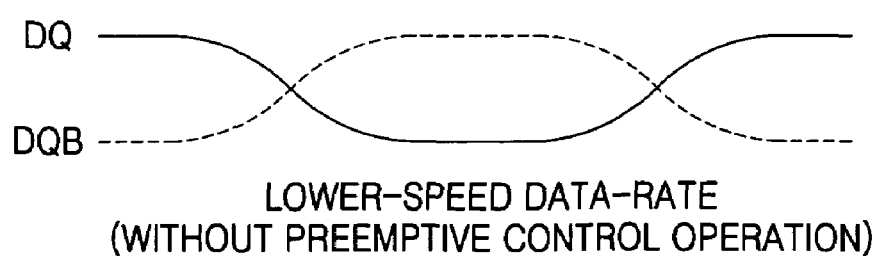

FIG. 17 illustrates waveforms of the data input/output signal DQ and the complementary data input/output signal DQB at a higher-speed data rate and a lower-speed data rate of the output driver 1200 of FIG. 15.

In the example embodiment of FIG. 17, when the output driver 1200 uses the higher-speed data rate and is at the first logic level, the first logic level (e.g., a higher logic level) may transition to a third logic level (e.g., slightly lower than the first logic level) before transitioning to the second logic level (e.g., a lower logic level as compared to the first and third logic levels). Likewise, when the output driver 1200 uses the higher-speed data rate and is at the second logic level, the second logic level (e.g., a lower logic level) may transition to a fourth logic level (e.g., slightly higher than the second logic level) before transitioning to the first logic level (e.g., higher than the second and fourth logic levels).

In the example embodiment of FIG. 17, when the output driver 1200 uses the lower-speed data rate, a swing width between the data input/output signal DQ and the complementary data input/output signal DQB may be lower as compared to the above-described example embodiment where the output driver 1200 uses the higher-speed data rate. Further, a slew rate of each of the data input/output signal DQ and the complementary data input/output signal DQB may be lower (e.g., may include a lower slope) as compared to the above-described embodiment where the output driver 1200 uses the higher-speed data rate.

Figure 18:
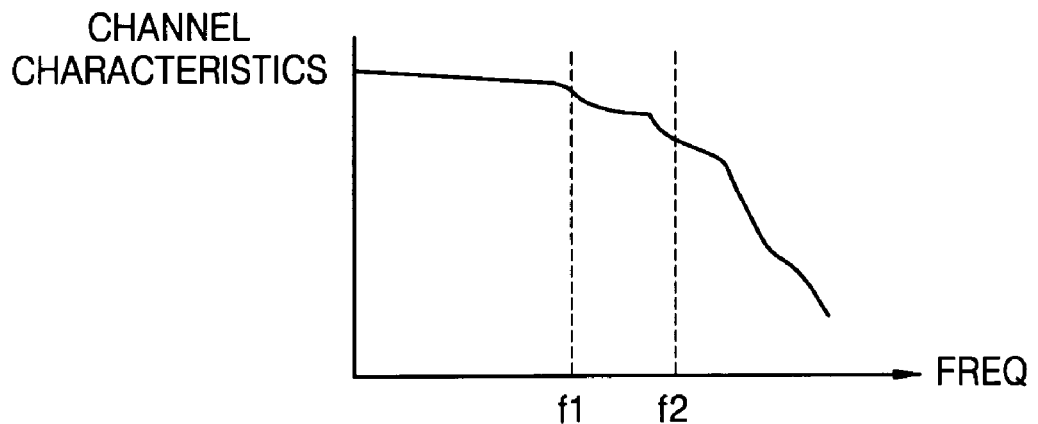
FIG. 18 is a graph illustrating channel characteristics for a transistor as an operating frequency FREQ increases according to another example embodiment of the present invention.

FIG. 18 is a graph illustrating channel characteristics for a transistor as an operating frequency FREQ increases according to another example embodiment of the present invention.

In the example embodiment of FIG. 18, the channel characteristics of the transistor (e.g., an NMOS transistor) may decrease as the operating frequency FREQ increases. However, this decrease to or deterioration of the channel characteristics may be reduced with the above-described preemptive control operation where, for example, the second differential amplification unit 1220 of FIG. 15 may adjust (e.g., increase or decrease) voltage levels of the data input/output signal DQ and/or the complementary data input/output signal DQB based on the third and fourth input signals IN1(t−1) and IN2(t−1) before generating the data input/output signal DQ and the complementary data input/output signal DQB from the first and second input signals IN1 (t) and IN2(t) of the first differential amplification unit 1210.

Figure 19:
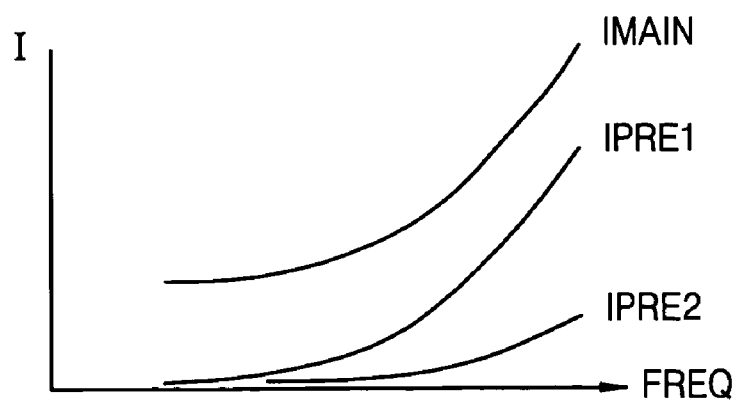
FIG. 19 is a graph illustrating channel characteristics for a transistor as an operating frequency FREQ increases according to another example embodiment of the present invention.
Figure 20:
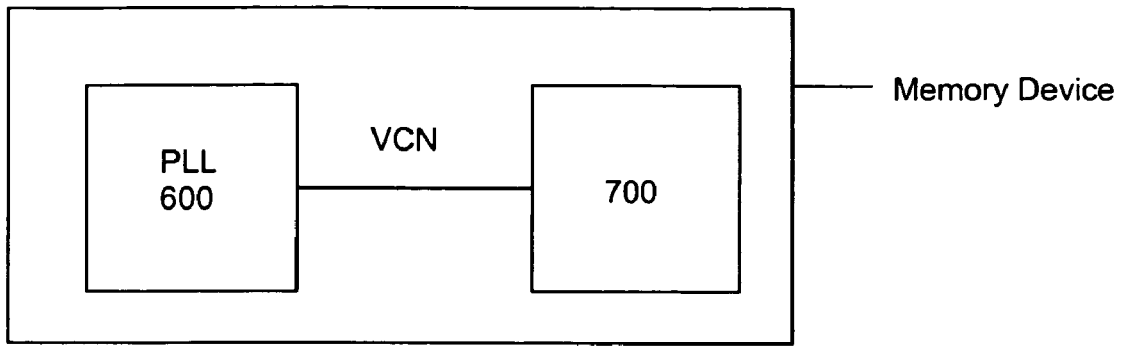
FIGS. 20-22 illustrate memory devices according to example embodiments.
Figure 21:
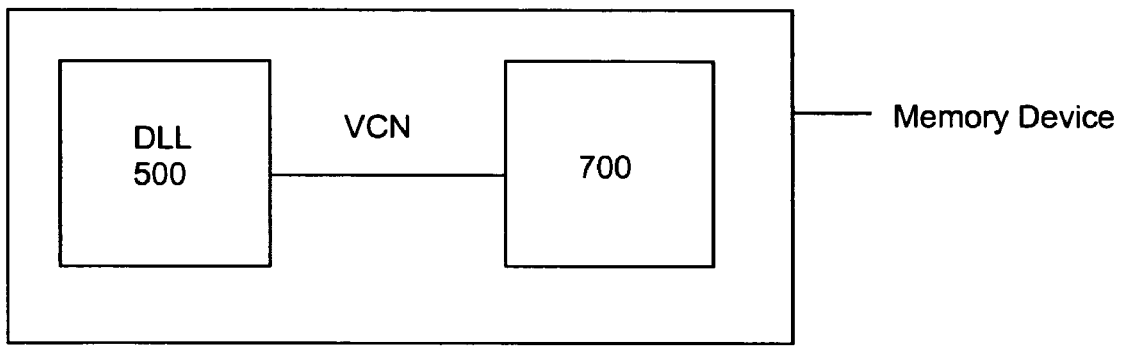
Figure 22:
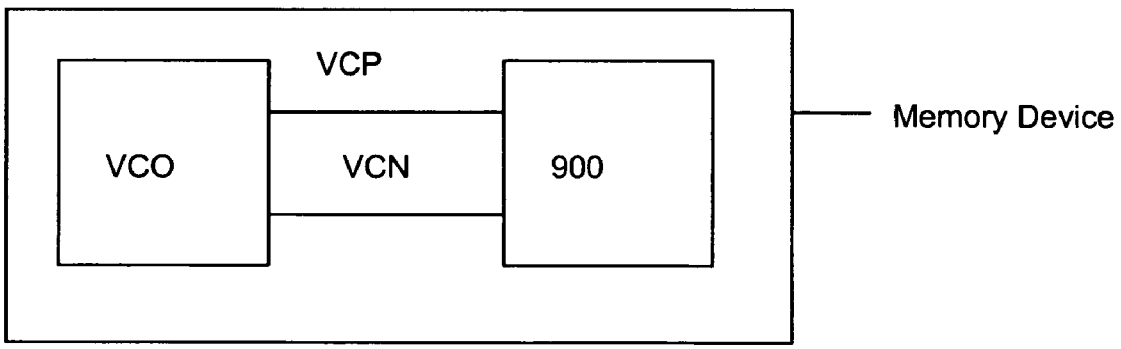

FIG. 19 is another graph illustrating channel characteristics for a transistor as an operating frequency FREQ increases according to another example embodiment of the present invention.

In the example embodiment of FIG. 19, the output driver 1200 of FIG. 15 may further include a third differential amplification unit (not shown), for example, having the same structure as the second differential amplification unit 1220. The third differential amplification unit may adjust (e.g., increase or decrease) voltage levels of the data input/output signal DQ and the complementary data input/output signal DQB based on previous signals (e.g., signals preceding the third and fourth input signals chronologically) of the third and fourth input signals IN1(t−1) and IN2(t−1), which may be referred to as a fifth input signal IN1(t−2) and a sixth input signal IN2(t−2), before generating the data input/output signal DQ and the complementary data input/output signal DQB from the third and fourth input signals IN1(t−1) and IN2(t−1). Accordingly, the first tail current source current IMAIN of the first differential amplification unit 1210, a second tail current IPRE1 of the second differential amplification unit 1220 and a third tail current IPRE2 of the third differential amplification unit (not shown) may increase as an operating frequency FREQ of the output driver 1200 increases.

Example embodiments of the present invention being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention. Likewise, while the third and fourth logic levels are above-described as being slightly lower than the first logic level and slightly higher than the second logic level, respectively, it is understood that other example embodiments of the present invention may include other relative relationships between the logic or voltage levels of the first, second, third and fourth logic levels.

Further, while above-described example embodiments use the preemptive control operating exclusively with output drivers (e.g., output drivers 400/700/900/1200) operating at the higher-speed data rate, it is understood that other example embodiments may use the preemptive control operation for output drivers operating at the lower-speed date rate and/or other data rates.

Further, while above-described example embodiments include two or three differential amplification units, it is understood that other example embodiments of the present invention may scale to include any number of differential amplification units.

Further, it is understood that a tail current source (e.g., tail current source 405, 705, 907, 1208, etc.) is not limited to the above-described tail current sources, and tail current sources in other example embodiments of the present invention may include any type of current source.

Further, while above-described example embodiments employ particular combinations of features, it is understood that each of the features included in the above-described example embodiments may be used together or interchangeably in other example embodiments of the present invention. For example, a differential amplification unit may be included within a circuit having a resistor group in another example embodiment of the present invention.

Further, while above-described voltages and/or currents are illustrated (e.g., in FIGS. 5, 11, 13 16, 18 and 19) having a given relationship (e.g., linear, exponential, increasing, decreasing, etc.) with respect to an operating frequency, it is understood that other example embodiments may include a different given relationship (e.g., linear, exponential, increasing, decreasing, etc.).

Such variations are not to be regarded as departure from the spirit and scope of example embodiments of the present invention, and all such modifications as would be obvious to one skilled in the art are intended to be included within the scope of the following claims.

We claim:

1. An output driver operating at a given data rate, comprising:
    a plurality of transistors including a first and a second transistor, receiving at least one input signal;
    a plurality of resistors including a first resistor connected between a drain of the first transistor and a first voltage and a second resistor connected between a drain of the second transistor and the first voltage, the first resistor being a portion of a first plurality of resistors and the second resistor being a portion of a second plurality of resistors, wherein at least one of the first or second plurality of resistors is selectively connected in response to at least one code signal generated through an analog-to-digital conversion of a voltage in a voltage controlled oscillator; and
    a tail current source connected between the plurality of transistors and a second voltage, the tail current source controlling a given current level of at least one signal based at least in part on the given data rate, wherein the given current level is further based at least in part on a control signal and the control signal is received from a variable delay line within a delay locked loop circuit.

2. The output driver of claim 1, wherein the first voltage is a power supply voltage and the second voltage is a ground voltage.

3. The output driver of claim 1, wherein
    the at least one input signal includes a first input signal and a second input signal, a gate of the first transistor and a gate of the second transistor receiving the first and second input signals, respectively, and
    the tail current source is connected between sources of the first and second transistors, respectively, and the second voltage.

4. The output driver of claim 3, wherein the tail current source includes a third transistor having a gate receiving the control signal, a drain connected to each of the source of the first transistor and the source of the second transistor and a source connected to the second voltage.

5. The output driver of claim 4, wherein at least one of the first, second and third transistors are NMOS transistors.

6. The output driver of claim 1, wherein the plurality of transistors includes at least one NMOS transistor.

7. The output driver of claim 1, wherein the variable delay line is included within a memory device.

8. The output driver of claim 1, wherein the first plurality of resistors is connected between the drain of the first transistor and the first voltage and the second plurality of resistors is connected between the drain of the second transistor and the first voltage.

9. The output driver of claim 8, wherein the tail current source includes a third transistor having a gate receiving the control signal, a drain connected to each of the source of the first transistor and the source of the second transistor and a source connected to the second voltage.

10. The output driver of claim 1, wherein the control signal is received from a voltage controlled oscillator within a phase locked loop circuit included together with the output driver in a memory device.

11. The output driver of claim 1, wherein the delay locked loop circuit is included within a memory device.

12. The output driver of claim 1, wherein the voltage controlled oscillator is included within a phase locked loop circuit.

13. The output driver of claim 12, wherein the phase locked loop circuit is included within a memory device.

14. The output driver of claim 1, wherein the drain of the first transistor and the drain of the second transistor are connected to first and second data input/output signals, respectively.

15. The output driver of claim 14, wherein the at least one signal includes the first and second data input/output signals.

* * * * *